(12) United States Patent
Keller et al.

(10) Patent No.: US 7,124,393 B1
(45) Date of Patent: Oct. 17, 2006

(54) SYSTEM AND METHOD FOR PROCESSING CONFIGURATION INFORMATION

(75) Inventors: S. Brandon Keller, Evans, CO (US); Gregory Dennis Rogers, Fort Collins, CO (US); George Harold Robbert, Fort Collins, CO (US)

(73) Assignee: Hewlett-Packard Development Company, LP., Houston, TX (US)

( * ) Notice: Subject to any disclaimer, the term of this patent is extended or adjusted under 35 U.S.C. 154(b) by 359 days.

(21) Appl. No.: 10/768,442

(22) Filed: Jan. 30, 2004

(51) Int. Cl.
*G06F 17/50* (2006.01)

(52) U.S. Cl. ............................................. 716/18; 716/1

(58) Field of Classification Search ...................... None
See application file for complete search history.

(56) References Cited

U.S. PATENT DOCUMENTS

| | | | | |
|---|---|---|---|---|
| 5,491,640 A * | 2/1996 | Sharma et al. | ................. | 716/18 |
| 5,519,627 A * | 5/1996 | Mahmood et al. | ............ | 716/18 |
| 5,841,663 A * | 11/1998 | Sharma et al. | ................. | 716/18 |
| 6,421,818 B1 * | 7/2002 | Dupenloup et al. | ........... | 716/18 |
| 6,477,683 B1 * | 11/2002 | Killian et al. | .................. | 716/1 |
| 6,678,873 B1 * | 1/2004 | Kohashi et al. | ............... | 716/11 |
| 6,757,882 B1 * | 6/2004 | Chen et al. | .................... | 716/12 |
| 6,826,732 B1 * | 11/2004 | Hunt et al. | ..................... | 716/1 |
| 6,941,527 B1 * | 9/2005 | Roesner et al. | ................ | 716/2 |
| 2005/0050509 A1 * | 3/2005 | Fields et al. | ................... | 716/18 |
| 2005/0149883 A1 * | 7/2005 | Roesner et al. | ................ | 716/1 |

OTHER PUBLICATIONS

Keller, S. Brandon; Rogers, Dennis R.; Robbert, George H.; U.S. Appl. No. 10/647,596, Entitled: System And Method Analyzing Design Elements In Computer Aided Design Tools; filed Aug. 25, 2003.

Keller, S. Brandon; Rogers, Dennis R.; Robbert, George H.; U.S. Appl. No. 10/647,608, Entitled: System And Method For Determining Unmatched Design Elements In A Computer-Automated Design; filed Aug. 25, 2003.

Keller, S. Brandon; Rogers, Dennis R.; Robbert, George H.; U.S. Appl. No. 10/647,606; Entitled: System And Method For Determining Connectivity Of Nets In A Hierarchical Circuit Design; filed Aug. 25, 2003.

Keller, S. Brandon; Rogers, Dennis R.; Robbert, George H.; U.S. Appl. No. 10/647,598, Entitled: Computer Aided Design System And Methods With Reduced Memory Utilization; filed Aug. 25, 2003.

Keller, S. Brandon; Rogers, Dennis R.; Robbert, George H.; U.S. Appl. No. 10/647,688, Entitled: System And Method For Iteratively Traversing A Hierarchical Circuit Design; filed Aug. 25, 2003.

Keller, S. Brandon; Rogers, Dennis R.; Robbert, George H.; U.S. Appl. No. 10/647,769, Entitled: Systems And Methods For Establishing Data Model Consistency Of Computer Aided Design Tools; filed Aug. 25, 2003.

Keller, S. Brandon; Rogers, Dennis R.; Robbert, George H.; U.S. Appl. No. 10/647,594, Entitled: Systems And Methods For Determining Activity Factors Of A Circuit Design; filed Aug. 25, 2003.

Keller, S. Brandon; Rogers, Dennis R.; Robbert, George H.; U.S. Appl. No. 10/647,687, Entitled: Systems And Methods Utilizing Fast Analysis Information During Detailed Analysis Of A Circuit Design; filed Aug. 25, 2003.

(Continued)

*Primary Examiner*—Leigh M. Garbowski

(57) ABSTRACT

A system, method and software product processes configuration information. One or more configuration elements are identified from one or more configuration commands and associated with design elements of an electronic circuit design. Each configuration element is retrieved for at least one design element.

18 Claims, 4 Drawing Sheets

OTHER PUBLICATIONS

Keller, S. Brandon; Rogers, Dennis R.; Robbert, George H.; U.S. Appl. No. 10/647,595, Entitled: System And Method For Determining Applicable Configuration Information For Use In Analysis Of A Computer Aided Design; filed Aug. 25, 2003.

Keller, S. Brandon; Rogers, Dennis R.; Robbert, George H.; U.S. Appl. No. 10/647,607, Entitled: Systems And Methods For Identifying Data Sources Associated With A Circuit Design; filed Aug. 25, 2003.

Keller, S. Brandon; Rogers, Dennis R.; Robbert, George H.; U.S. Appl. No. 10/647,605, Entitled: Systems And Methods For Performing Circuit Analysis On A Circuit Design; filed Aug. 25, 2003.

Keller, S. Brandon; Rogers, Dennis R.; Robbert, George H.; U.S. Appl. No. 10/647,768, Entitled: System And Method For Determining A Highest Level Signal Name In A Hierarchical VLSI Design; filed Aug. 25, 2003.

Keller, S. Brandon; Rogers, Dennis R.; Robbert, George H.; U.S. Appl. No. 10/647,597, Entitled: System And Method For Determining Wire Capacitance For A VLSI Circuit; filed Aug. 25, 2003.

Keller, S. Brandon; Rogers, Dennis R.; Lelm, Charles A.; U.S. Appl. No. 10/706,682, Entitled: Method And Program Product For Determining Nets Requiring Detailed Electromigration And Self Heating Analysis In A Digital Integrated Circuit; filed Nov. 12, 2003.

Keller, S. Brandon; Rogers, Dennis R.; Lelm, Charles A.; U.S. Appl. No. 10/706,698, Entitled: Method And Program Product For Performing Self-Heating Analysis In A Digital Integrated Circuit Through A Single Cycle Transient Simulation; filed Nov. 12, 2003.

Keller, S. Brandon; Rogers, Dennis R.; Lelm, Charles A.; U.S. Appl. No. 10/706,376, Entitled: Method And Program For Visual Display and One-Click Repair Of Electromigration And Self Heating Design-Rule Violations In A Digital Integrated Circuit Layout Database; filed Nov. 12, 2003.

Keller, S. Brandon; Rogers, Dennis R.; Lelm, Charles A.; U.S. Appl. No. 10/706,501, Entitled: Method And Program Product For Performing Electromigration Analysis In A Digital Integrated Circuit By Converting A Netlist To A DC Model And Performing DC Analysis Of The DC Model; filed Nov. 12, 2003.

Keller, S. Brandon; Rogers, Dennis R.; Lelm, Charles A.; U.S. Appl. No. 10/706,526, Entitled: Method And Program Product For Performing A Worst Case Electromigration And Self Heating Analysis In A Digital Integrated Circuit With Worst-Case Superposition Of Partial Currents; filed Nov. 12, 2003.

Keller, S. Brandon; Rogers, Dennis R.; Lelm, Charles A.; U.S. Appl. No. 10/706,692, Entitled: Method And Program Product For Performing Electromigration Analysis In A Digital Integrated Circuit Through A Single Cycle Transient Simulation; filed Nov. 12, 2003.

Keller, S. Brandon; Rogers, Dennis R.; Lelm, Charles A.; U.S. Appl. No. 10/706,508, Entitled: Method And Program Product For Performing Self-Heating Analysis In A Digital Integrated Circuit Layout Database by Substituting Resistive Models For Active Devices; filed Nov. 12, 2003.

* cited by examiner

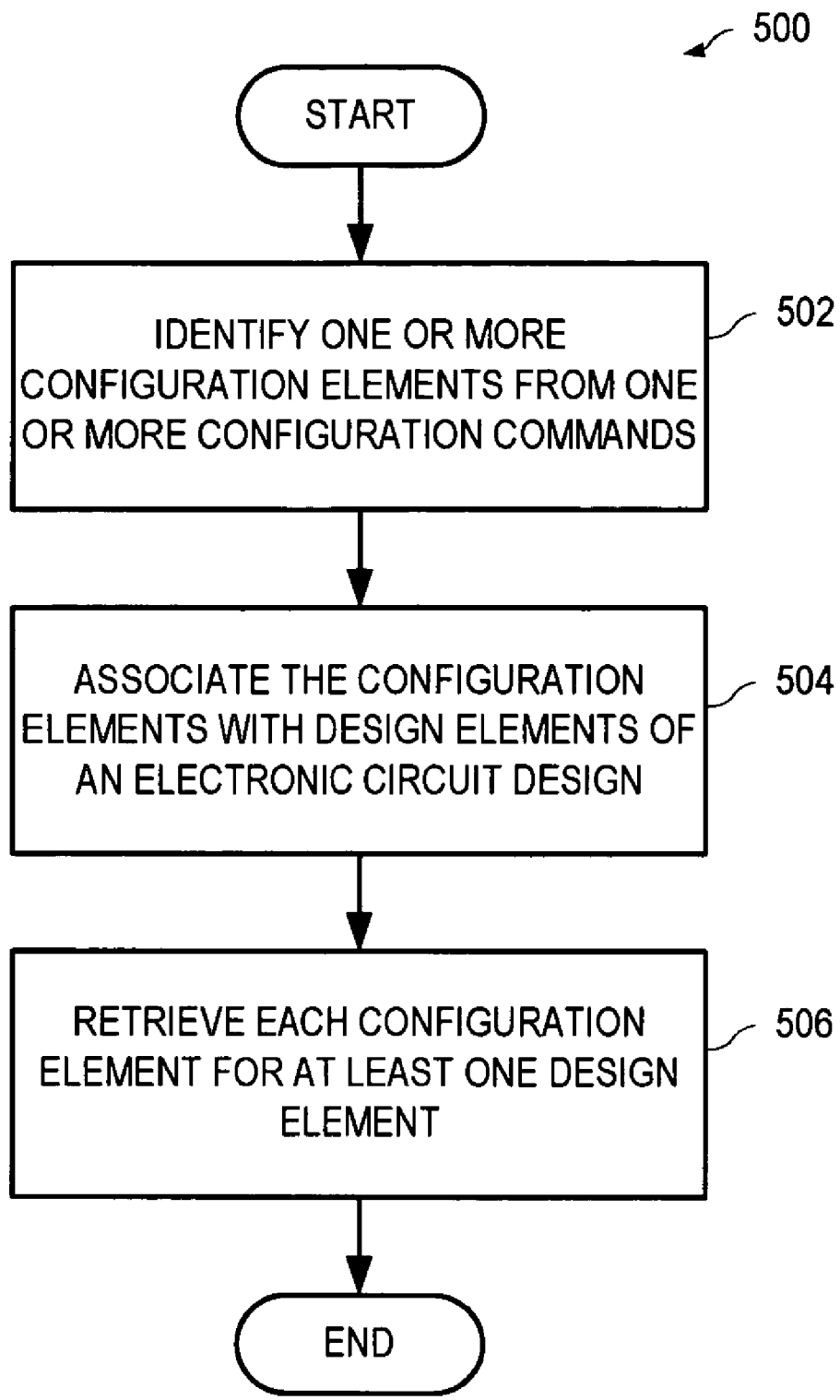

SYSTEM AND METHOD FOR PROCESSING CONFIGURATION INFORMATION

RELATED APPLICATIONS

This application is related to the following commonly owned and co-filed U.S. Patent applications, filed Jan. 30, 2004 and incorporated herein by reference: U.S. patent application Ser. No. 10/769,675, titled "Method and program product for determining worst case currents in a digital integrated circuit through worst-case superposition of partial currents"; U.S. patent application Ser. No. 10/769,495, titled "Systems and methods that identify equivalent instantiation-specific configuration information for analysis tools"; U.S. patent application Ser. No. 10/769,687, titled "System and method for determining detail of analysis in a circuit design"; U.S. patent application Ser. No. 10/769,676, titled "System and method for indicating logic state combinations used during circuit design analysis"; U.S. patent application Ser. No. 10/769,702, titled "Systems and methods for re-using circuit design analysis results", U.S. patent application Ser. No. 10/769,683, titled "System and method for balancing run-time and result accuracy in a circuit design analysis tool"; U.S. patent application Ser. No. 10/769,673, titled "System and method for determining control signal combinations for use during simulation of a stage of a circuit design"; and U.S. patent application Ser. No. 10/769,682, titled "System and method to limit analyzed current flow in a circuit design".

BACKGROUND

An electronic computer aided design ("E-CAD") package is utilized to construct a Very Large Scale Integration ("VLSI") circuit design. The VLSI circuit design consists of a netlist that identifies electronic design elements (e.g., capacitors, transistors, resistors, etc.) and their interconnectivity (e.g., signal nets) within the VLSI circuit design. The VLSI circuit design is constructed from hierarchical cells (also known as design blocks) that provide specific functionality to the VLSI circuit design. Cells may be constructed from electronic design elements, nets and other cells, and may be re-used one or more times. Each use or instantiation of a cell in the VLSI circuit design is called an "instance."

A signal net is a single electrical path in a circuit design that has the same electrical characteristics at all of its points. Any collection of wires that carries the same signal between design elements is a signal net. If the design elements allow the signal to pass through unaltered (as in the case of a terminal), then the signal net continues on subsequently connected wires. If, however, the design element modifies the signal (as in the case of a transistor or logic gate), then the signal net terminates at that design element and a new signal net begins on the other side.

A signal net may be divided into signal net 'pieces', each of which is part of a Highest Level Signal Name ("HLSN"). A HLSN is the unique signal name that identifies a collection of signal nets or 'hierarchical signal net pieces', which are the small pieces of intermediate wire (signal nets) in each hierarchical design block of a circuit design.

A significant characteristic of VLSI and other types of circuit design is a reliance on hierarchical description. A primary reason for using hierarchical description is to hide the vast amount of detail in a design. By reducing the distracting detail to a single object that is lower in the hierarchy, one can greatly simplify many E-CAD operations. For example, simulation, verification, design-rule checking, and layout constraints can all benefit from hierarchical representation, which makes them more computationally tractable. Since many circuit designs are too complicated to be easily considered in their totality, a complete circuit design is often viewed as a collection of design element aggregates that are further divided into sub-aggregates in a recursive and hierarchical manner. In VLSI circuit design, these aggregates are commonly referred to as design blocks or cells, as noted above. Each cell also typically has one or more 'ports'; each port provides a connection point between a signal net within the cell and a signal net external to the cell.

A design engineer uses the E-CAD tool to analyze the VLSI circuit design during development. The E-CAD tool typically selects a 'stage' within the circuit design for analysis. The stage is contained within one cell that may be instantiated one or more times in the VLSI circuit design; the VLSI circuit design, therefore, may contain more than one identical stage. Each stage in the circuit design has instantiation-specific configuration information that is used by the E-CAD tool during analysis of the stage. The instantiation-specific configuration information may have several different sources, including input/output from other analysis tools and user input.

The E-CAD tool may perform several types of analyses (using different analysis tools, for example) on the VLSI circuit design, with each analysis utilizing particular configuration information. Each analysis tool that accesses configuration information typically parses textual configuration information contained in configuration files. These configuration files may therefore be parsed several times during analysis of the many stages of a VLSI circuit design.

If the VLSI circuit design contains billions of design elements and has many stages, the analyses can take hours or even days of processing time to complete, resulting in lost productivity. Continuous lost productivity due to lengthy engineering development slows technology advancement and can result in significant costs, as well as lost business.

SUMMARY OF THE INVENTION

In one embodiment, a method processes configuration information. One or more configuration elements are identified from one or more configuration commands. The configuration elements are associated with design elements of an electronic circuit design. Each configuration element is retrieved for at least one design element.

In another embodiment, a system processes configuration information, including: means for identifying at least one configuration element from at least one configuration command; means for associating the configuration element with one or more design elements of an electronic circuit design; means for retrieving each configuration element associated with at least one design element.

In another embodiment, a software product has instructions, stored on computer-readable media, wherein the instructions, when executed by a computer, perform steps for processing configuration information, including: instructions for identifying one or more configuration elements from one or more configuration commands; instructions for associating the configuration elements with design elements of an electronic circuit design; instructions for retrieving each configuration element for at least one design element.

BRIEF DESCRIPTION OF THE FIGURES

FIG. 5 is a flowchart illustrating one embodiment of a method for processing configuration information.

DETAILED DESCRIPTION OF THE FIGURES

To analyze a circuit design (e.g., a very large scale integration (VLSI) circuit design), electronic computer aided design (E-CAD) tools often utilize vast amounts of configuration information. The speed at which the E-CAD tool accesses the configuration information thus impacts analysis tool performance. Certain systems and methods now described improve this access speed by making configuration information available on a net-by-net basis, and by enabling other E-CAD tools access to the configuration information.

Figure 1:
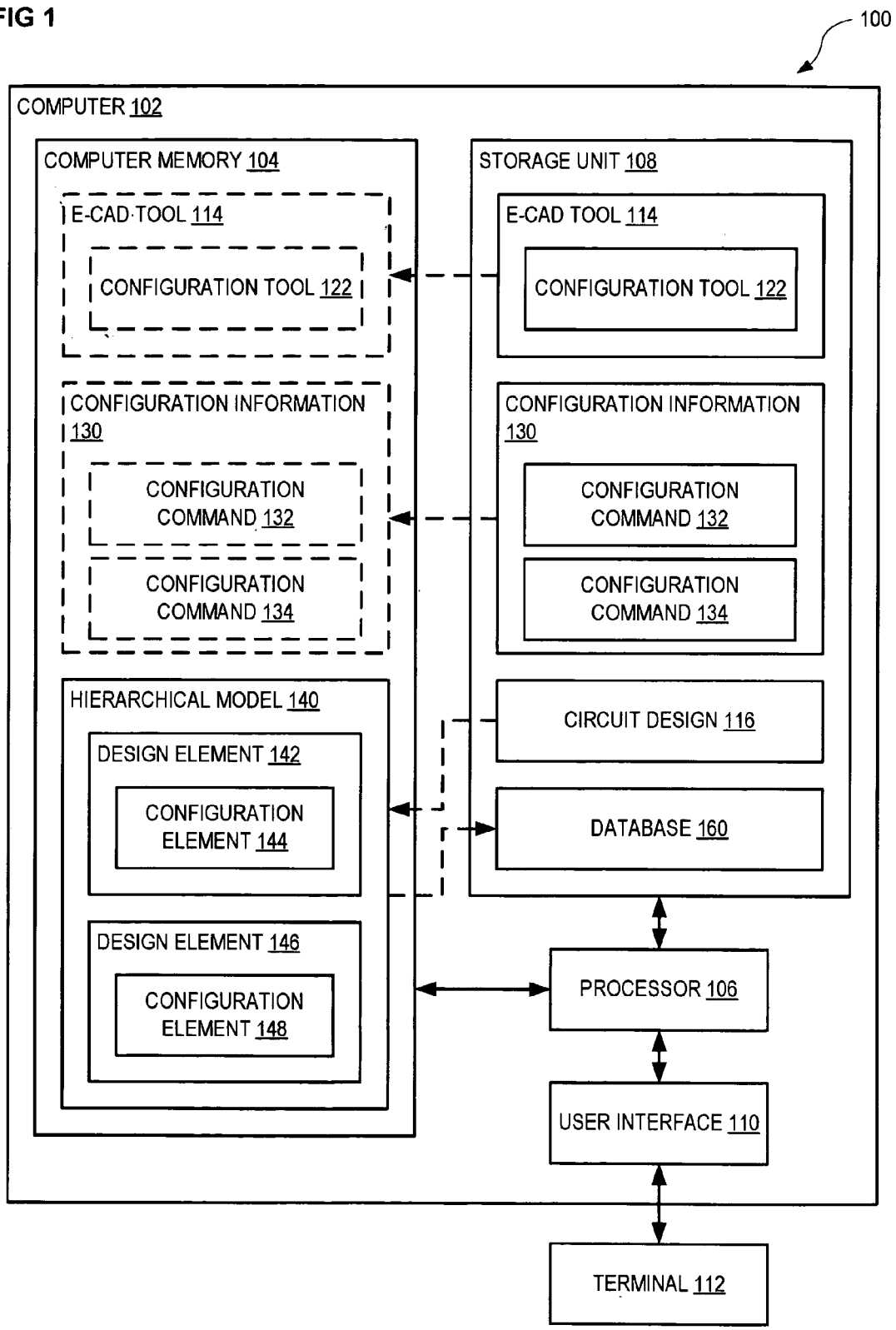
FIG. 1 illustrates one system embodiment for processing configuration information.

FIG. 1 illustrates one system 100 that processes configuration information, such as to expedite CAD tool access to the configuration information. System 100 has a computer 102 with computer memory 104, a processor 106, a storage unit 108 and a user interface 110. Storage unit 108 is, for example, a disk drive that stores programs and data of computer 102. Storage unit 108 is illustratively shown storing an E-CAD tool 114, a circuit design 116, configuration information 130, and database 160. E-CAD tool 114 has a configuration tool 122. Circuit design 116 is, for example, a VLSI circuit design created by E-CAD tool 114. Configuration information 130 is illustratively shown with exemplary configuration commands 132 and 134.

Processor 106 loads E-CAD tool 114 from storage unit 108 into computer memory 104 such that E-CAD tool 114 is executable by processor 106. E-CAD tool 114 may in turn request that processor 106 load configuration tool 122 and configuration information 130 from storage unit 108 into computer memory 104. E-CAD tool 114, configuration tool 122 and configuration information 130 are thus shown in dashed outline in computer memory 104, for purposes of illustration. Once loaded into computer memory 104, E-CAD tool 114 processes configuration information 130 to generate database 160, which may be stored in storage unit 108, as shown, or in computer memory 104 as a matter of design choice. Configuration information 130 may be loaded into computer memory 104 by either E-CAD tool 114 or configuration tool 122.

Configuration tool 122 creates a hierarchical model 140 based upon circuit design 116 in computer memory 104. Hierarchical model 140 is illustratively shown with two design elements 142 and 146. Design element 142 has a configuration element 144, and design element 146 has a configuration element 148. Design elements 142 and 146 are, for example, signal nets within circuit design 116. Capacitors, transistors and resistors may also be design elements.

By way of illustrative operation, user interface 110 connects to a terminal 112 (e.g., a keyboard) external to computer 102. Through terminal 112 and user interface 110, the design engineer interacts with E-CAD tool 114 and configuration tool 122. In one example, the design engineer instructs E-CAD tool 114 to process configuration information 130 for circuit design 116 using configuration tool 122. Configuration tool 122 then processes configuration information 130 to match design elements (e.g., design elements 142, 146) within hierarchical model 140 with one or more configuration commands (e.g., configuration commands 132, 134). In one example, design element 142 is matched to configuration command 132 and configuration information pertaining to design element 142 is stored in configuration element 144. Similarly, design element 146 is matched to configuration command 134 and configuration information pertaining to design element 146 is stored in configuration element 148. Configuration tool 122 then traverses hierarchical model 140 to produce database 160.

Configuration commands 132 and 134 may for example define rise and fall times of signals on signals nets within circuit design 116, logic configuration commands that define input signal combinations within circuit design 116, activity factors of signals nets within circuit design 116, drive fight periods that define the percentage of time that two connected drivers drive opposing signal polarities, crossover current scale factors that specify the amount of time driver outputs compete when changing state, capacitance adjustments on various nets, etc.

Configuration information 130 may include logic commands that define states and logic relationships for signals nets within circuit design 116. Exemplary logic commands are given below in Example Logic Commands.

Example Logic Commands

| Command 1: | if0then1 A B |
|---|---|
| Command 2: | if1then0 A B |
| Command 3: | if0then0 A B |
| Command 4: | if1then1 A B C D |
| Command 5: | mutex0 A B C D |
| Command 6: | mutex1 A B C D |
| Command 7: | imutex0 A B C D |
| Command 8: | imutex1 A B C D |
| Command 9: | set_high A |
| Command 10: | set_low A |

In Example Logic Commands, Command 1 specifies that if signal A is 0 then signal B is set to 1. Command 2 specifies that if signal A is 1 then signal B is set to 0. Command 3 specifies that if signal A is zero then signal B is set to 0. Command 4 specifies that if signal A is 1 then signals B, C and D are set to 1. Command 5 specifies that exactly one of signals A, B, C and D is set to 0 at any one time. Command 6 specifies that exactly one of signals A, B, C and D is set to 1 at any one time. Command 7 specifies that no more than one of signals A, B, C and D is set to 1 at any time, although all signals A, B, C and D may be 0. Command 8 specifies that no more than one of signals A, B, C and D is set to 0 at any one time, although all signals A, B, C and D may be 1. Command 9 specifies that signal A is always set to 1. Command 10 specifies that signal A is always set to 0.

Figure 2:
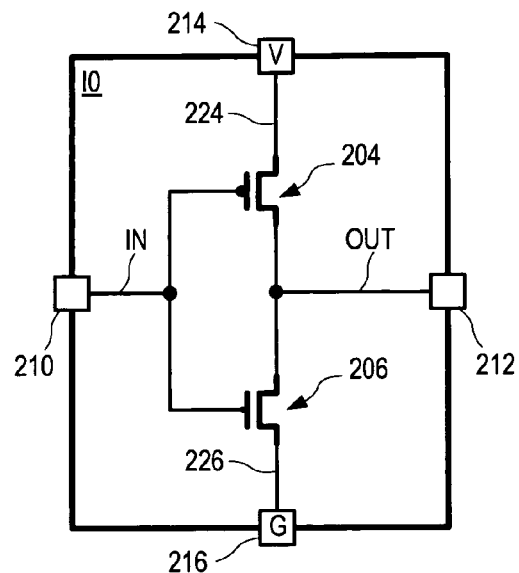
FIG. 2 is a schematic diagram of one cell with inverter functionality.
Figure 3:
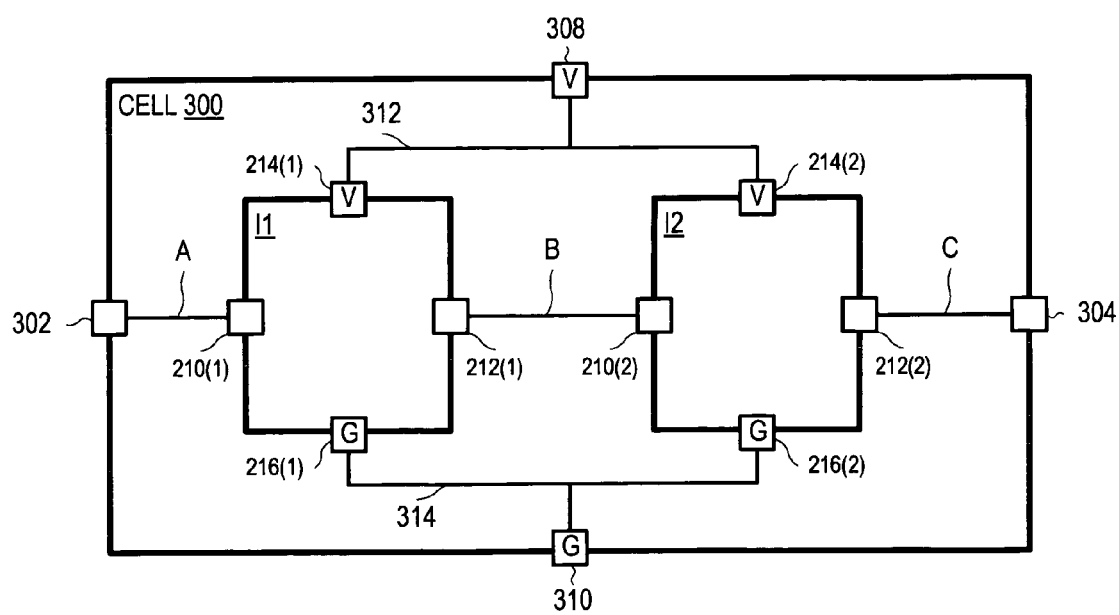
FIG. 3 is a block diagram illustrating one cell that twice instantiates the cell of FIG. 2.

FIG. 2 shows one exemplary cell 10 that includes circuitry to provide inverter functionality. Cell I0 is, for example, suitable for use within circuit design 116, FIG. 1. Cell I0 has four ports 210, 212, 214 and 216 and, in this example, includes a p-type field-effect transistor ("FET") 204 and an n-type FET 206 connected serially between port 214 and port 216. Port 214, labeled 'V', connects to power rail Voltage-Drain-Drain (VDD) and port 216, labeled 'G', connects to ground rail (GND). Cell I0 also has four signal nets IN, OUT, 224 and 226: signal net IN connects port 210 to gate terminals of FETs 204 and 206; signal net OUT connects a drain terminal of FET 204 and a source terminal of FET 206 (i.e., a common point between FETs 204 and 206) to output port 212; signal net 224 connects a source terminal of FET 204 to port 214; and signal net 226 connects a drain terminal of FET 206 to port 216. As shown in FIG. 3, cell I0 may be used within other cells to provide the inverter functionality, each use instantiating cell I0 within circuit design 116.

FIG. 3 illustrates one exemplary cell 300 with two instantiations I1, I2 of cell I0, FIG. 2. Cell 300 is, for example, suitable for use in circuit design 116, FIG. 1. Cell 300 has four ports 302, 304, 308 and 310. Port 302 is an input port that is connected to port 210(1) of cell instance I1 by signal net A. Port 212(1) of cell instance I1 is connected to port 210(2) of cell instance I2 by signal net B. Signal net C connects port 212(2) of cell instance I2 to output port 304. Port 308, labeled 'V', connects to power rail VDD and port 310, labeled 'G', connects to ground rail GND. Net 312 connects port 308 to ports 214(1) and 214(2); and net 314 connects port 310 to ports 216(1) and 216(2).

Using the example of FIG. 2 and FIG. 3, exemplary configuration commands are listed in Example Configuration Information below. Example Configuration Information is stored as configuration information 130, FIG. 1, for example.

Example Configuration Information

| | |
|---|---|
| subckt I0 rise_time_receiver IN 2ps | # line 1 |
| df * 0.0 | # line 2 |
| df C 0.01 | # line 3 |
| rise_time_receiver B 1.3ps | # line 4 |
| subckt I0 if1then0 IN OUT | # line 5 |
| subckt I0 if0then1 IN OUT | # line 6 |

Referring to FIG. 2, Example Configuration Information line 1 specifies a rise time of 2.0 picoseconds for signals received on signal net IN of cell I0. Accordingly, the configuration element associated with signal net IN for each instance of cell I0 (e.g., cell instances I1 and I2, FIG. 3) is updated to indicate a rise time of 2.0 picoseconds. Example Configuration Information line 2 uses a wildcard '*' to indicate that all signal nets within circuit design 116 have a drive fight factor of 0.0. Accordingly, all configuration elements associated with signal net design elements in hierarchical model 140 are updated to have a drive fight factor of 0.0. The drive fight factor represents the proportion of the clock period that a signal is in a drive fight condition. For example, a drive fight factor of 1.0 indicates that the signal is in the drive fight condition for the entire clock cycle; a drive fight factor of 0.5 indicates that the signal is in the drive fight condition for half the clock cycle. Example Configuration Information line 3 specifies a drive fight factor of 0.01 for signal net C, FIG. 3. Accordingly, only the configuration element associated with signal net C is updated with the drive fight factor 0.01, thereby overriding Example Configuration Information line 2 for signal net C. Example Configuration Information line 4 specifies a rise time of 1.3 picoseconds for signal net B. Accordingly, the configuration elements associated with signal net B is set to have a rise time of 1.3 picoseconds, thereby overriding Example Configuration Information line 1 for signal net B.

To illustrate exemplary processing of Example Configuration Information by configuration tool 122, consider signal net A as a first design element (e.g., design element 142) of hierarchical model 140. Configuration tool 122 matches the first design element to configuration commands (e.g., configuration command 132) within configuration information 130. For example, configuration tool 122 searches Example Configuration Information for configuration commands that apply to signal net A, and, in this example, determines: that line 1 applies since signal net A is the HLSN of signal net IN of cell instance I1; that line 2 applies since it uses a wildcard '*' that matches all signal nets; and that lines 5 and 6 apply since they identify signal net IN of cell I0, instantiated as cell I1 such that signal net A is the HLSN of signal net IN. Applicable configuration information of matched configuration commands (i.e., lines 1, 2, 5 and 6 of Example Configuration Commands, in this example) are stored in configuration elements (e.g., configuration element 144) within hierarchical model 140.

Once all design elements within hierarchical model 140 have been matched to configuration information 130, configuration tool 122 traverses hierarchical model 140 to generate database 160. Using the Example Configuration Information above, exemplary Database Record 1, Database Record 2, and Database Record 3 are now described.

Database Record 1, below, shows one exemplary database entry for signal net A, FIG. 3, resulting from processing Example Configuration Information, above, by configuration tool 122.

| Database Record 1 | |
|---|---|
| # net A | |
| Tr 2.0e−12 | # from line 1 |
| DF 0.0 | # from line 2 |
| I10 B | # from line 5 |
| I01 B | # from line 6 |

In Database Record 1, the first configuration command specifies that the rise time for signal net A of 2.0 picoseconds, a value derived from line 1 of Example Configuration Information. The second configuration command in Database Record 1 specifies a drive fight factor of 0.0, derived from Example Configuration Information line 2. The third and fourth configuration commands in Database Record 1 are derived from lines 5 and 6 of Example Configuration Information, respectively, and specify that if signal net A is high, signal net B is low, and if signal net A is low, signal net B is high. Database Record 1 includes configuration information from configuration information 130 pertaining to signal net A of circuit design 116.

It should be apparent that Example Configuration Information and Database Record 1 represent one example of processing by configuration tool 122, and should not be construed as limiting. Other configuration commands may be included in both configuration information 130 and database 160 as a matter of design choice without departing from the scope herein.

Database Record 2, below, shows one exemplary database entry for signal net B, FIG. 3, resulting from processing of Example Configuration Information, above, by configuration tool 122.

Database Record 2

| # net B | |
|---|---|
| Tr 1.3e−12 | # from line 4 |
| DF 0.0 | # from line 2 |
| I10 C | # from line 5 |
| I01 C | # from line 6 |

In Database Record 2, the first configuration command specifies that the rise time for signal net B of 1.3 picoseconds, a value derived from line 4 of Example Configuration Information. The second configuration command in Database Record 2 specifies a drive fight factor of 0.0, derived from Example Configuration Information line 2. The third and fourth configuration commands in Database Record 2 are derived from lines 5 and 6 of Example Configuration Information, respectively, and specify that if signal net B is high, signal net C is low, and if signal net B is low, signal net C is high. Database Record 2 includes configuration information from configuration information 130 pertaining to signal net B of circuit design 116.

Again it should be apparent that Example Configuration Information and Database Record 2 represent one example of processing by configuration tool 122, and should not be construed as limiting. Other configuration commands may be included in both configuration information 130 and database 160 as a matter of design choice without departing from the scope herein.

Database Record 3, below, shows one exemplary database entry for signal net C, FIG. 3, resulting from processing of Example Configuration Information, above, by configuration tool 122.

Database Record 3

| # net C | |
|---|---|
| DF 0.01 | # from line 3 |

Database Record 3 includes one configuration command that specifies a drive fight factor of 0.01, derived from Example Configuration Information line 3. It should be apparent that Example Configuration Information and Database Record 3 represent one example of processing by configuration tool 122, and should not be construed as limiting. Other configuration commands may be included in both configuration information 130 and database 160 as a matter of design choice without departing from the scope herein.

Figure 4:
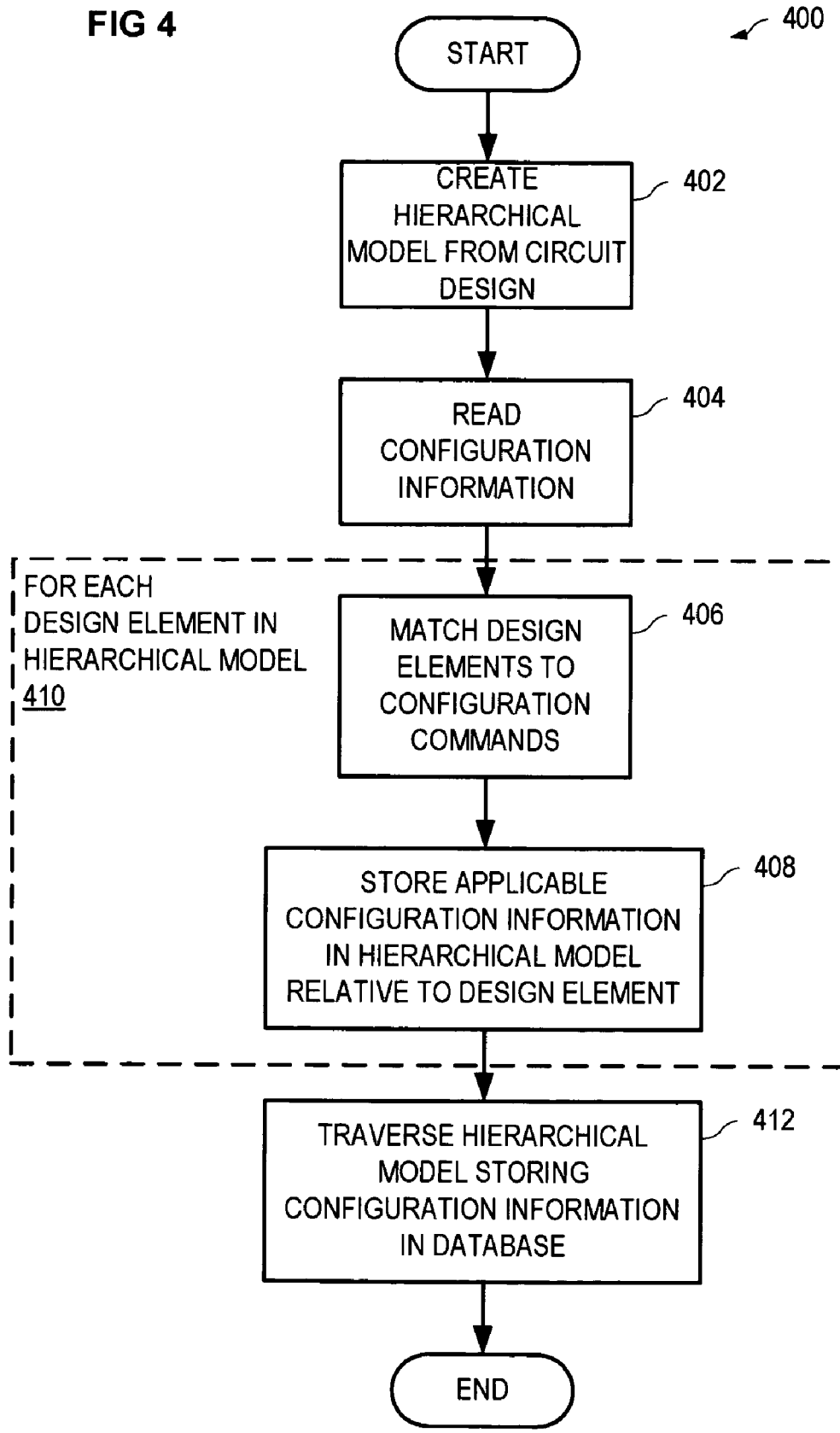
FIG. 4 is a flowchart illustrating one embodiment of a method for processing configuration information.

FIG. 4 is a flowchart illustrating one process 400 for processing configuration information. Process 400 is, for example, implemented by configuration tool 122, FIG. 1. In step 402, process 400 creates hierarchical model 140 in computer memory 104 from circuit design 116. In step 404, process 400 reads configuration information 130 into computer memory 104. In one example of step 404, process 400 reads one or more configuration files to generate configuration information 130 in computer memory 104. In step 406, process 400 matches one design element (e.g., design element 142) to identify zero or more configuration commands within configuration information 130 that provide configuration information pertinent to the one design element. For example, in step 406, process 400 matches configuration commands 132 to design element 142, thereby identifying configuration elements of configuration commands 132. In step 408, process 400 stores the identified configuration elements in hierarchical model 140. For example, in step 408, process 400 stores configuration information matched to design element 142 in configuration element 144, thereby associating configuration element 144 with design element 142. Steps 406 through 408 are repeated for each design element in hierarchical model 140, as indicated by section 410. In one example, process 400 sequentially selects each design element (e.g., design elements 142, 146) within hierarchical design 140, repeating steps 406 through 408 to store matched configuration information pertaining to each design element in associated data structures within hierarchical design 140.

Once all design elements have been matched to zero or more configuration commands (e.g., configuration elements 144, 148 are associated with design elements 142, 146, respectively), process 400 continues with step 412. In step 412, process 400 traverses hierarchical model 140, storing configuration elements (e.g., configuration elements 144, 148) of hierarchical model 140 in database 160 such that the information is associated with signal nets of circuit design 116. Database 160 thus allows one or more analysis tools to retrieve configuration elements associated with any selected design elements (e.g., a signal net) of circuit design 116 when analyzing or simulating circuit design 116.

FIG. 5 is a flowchart illustrating one process 500 for processing configuration information. Process 500 is, for example, implemented in configuration tool 122, FIG. 1. In step 502, process 500 identifies one or more configuration elements from one or more configuration commands. In step 504, process 500 associates the configuration elements with design elements of an electronic circuit design. In step 506, process 500 retrieves each configuration element for at least one design element.

As appreciated, hierarchical model 140 is more compact than configuration information 130; large configuration files can therefore be processed and stored in computer memory 104 allowing fast access to configuration elements 144, 148. Regular expression matching and parsing of configuration information 130 is consolidated and need only be performed once, evaluating configuration information 130 prior to use; errors and omissions of configuration information 130 may therefore be detected prior to initiation of one or more lengthy analyses. Since hierarchical model 140 is structured similarly to circuit design 116, configuration elements 144, 148 for a current analysis may be selectively and quickly retrieved from hierarchical model 140. Further, configuration elements 144, 148 are easily transformed at a global level, and additional configuration information may be derived and stored within hierarchical model 140 (requiring the derivation to be done only once).

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A method for processing configuration information associated with an electronic circuit design, comprising:

identifying one or more configuration elements from one or more configuration commands of the configuration information;

associating the configuration elements with design elements of the electronic circuit design, the configuration elements defining characteristics of the design elements; and retrieving, for at least one design element, each configuration element associated with the at least one design element.

2. The method of claim 1, the step of associating comprising generating one or more data structures containing configuration elements and then storing the data structures with their associated design elements in a hierarchical model of the electronic circuit design.

3. The method of claim 2, further comprising traversing the hierarchical model and, for each design element, storing, in a database, each configuration element associated with the design element.

4. The method of claim 3, the step of retrieving comprising specifying a design element to retrieve associated configuration elements.

5. The method of claim 1, the step of associating comprising storing the identified configuration elements and associated design elements on a design element by design element basis in a database.

6. The method of claim 1, the design element comprising an HLSN.

7. A system for processing configuration information, comprising:
    means for identifying at least one configuration element from at least one configuration command;
    means for associating the configuration element with one or more design elements of an electronic circuit design; and
    means for retrieving each configuration element associated with at least one design element without further parsing of the configuration commands.

8. The system of claim 7, the means for associating comprising means for generating one or more data structures containing configuration elements, and means for storing the data structures with their associated design elements in a hierarchical model of the electronic circuit design.

9. The system of claim 8, further comprising means for traversing the hierarchical model and, for each design element, means for storing, in a database, each configuration element associated with the design element.

10. The system of claim 9, the means for retrieving comprising means for specifying a design element to retrieve associated configuration elements.

11. The system of claim 7, the means for associating comprising means for storing the identified configuration elements and associated design elements on a design element by design element basis in a database.

12. The system of claim 7, the design element comprising an HLSN.

13. A software product comprising instructions, stored on computer-readable media, wherein the instructions, when executed by a computer, perform steps for processing configuration information, comprising:
    instructions for identifying one or more configuration elements from one or more configuration commands;
    instructions for associating the configuration elements with design elements of an electronic circuit design; and
    instructions for retrieving, for at least one design element, each configuration element associated with the at least one design element and without further parsing of the configuration commands.

14. The software product of claim 13, the instructions for associating comprising instructions for generating one or more data structures containing configuration elements and then instructions for storing the data structures with their associated design elements in a hierarchical model of the electronic circuit design.

15. The software product of claim 14, further comprising instructions for traversing the hierarchical model and, for each design element, instructions for storing, in a database, each configuration element associated with the design element.

16. The software product of claim 15, the instructions for retrieving comprising instructions for specifying a design element to retrieve associated configuration elements.

17. The software product of claim 13, the instructions for associating comprising instructions for storing the identified configuration elements and associated design elements on a design element by design element basis in a database.

18. The software product of claim 13, the design element comprising an HLSN.

* * * * *